Aug. 6, 1968 W. H. HORTON 3,396,287
CRYSTAL STRUCTURES AND METHOD OF FABRICATING THEM
Filed Sept. 29, 1965
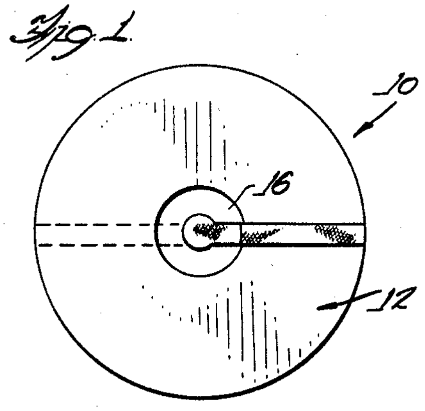
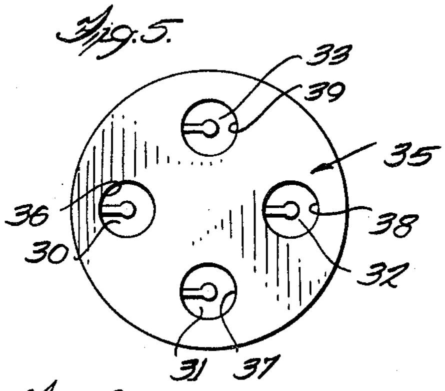
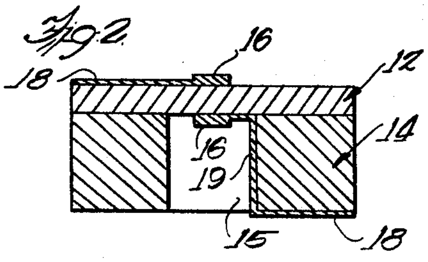
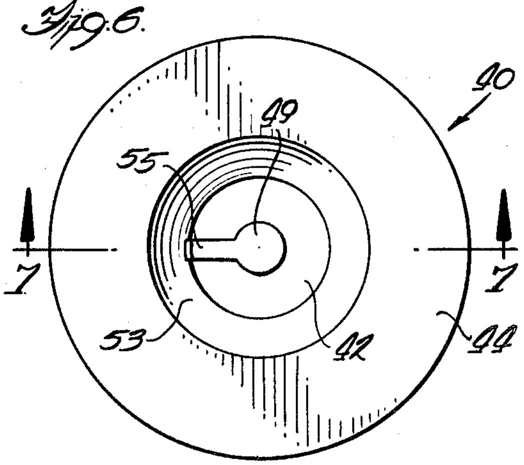
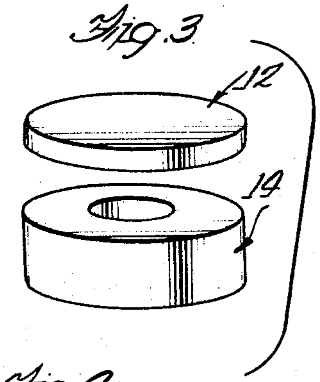
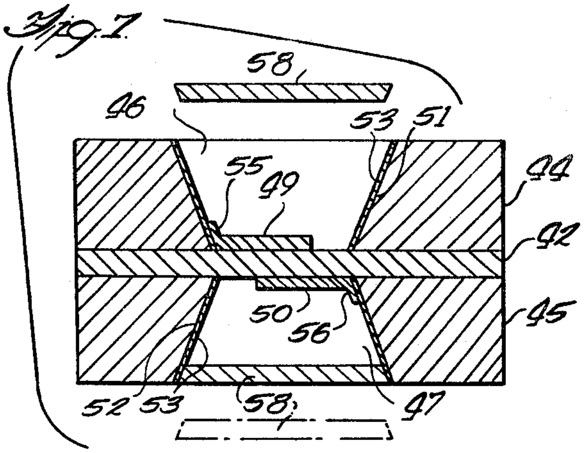
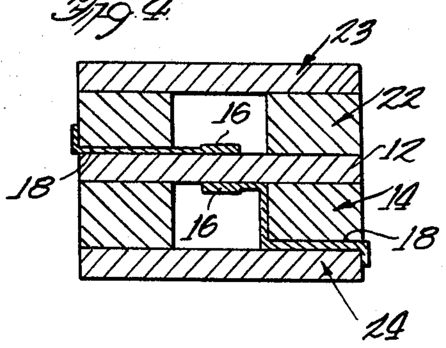
Inventors
William H. Horton
Dominik & Stein
Attorneys United States Patent Office 3,396,287

Patented Aug. 6, 1968

3,396,287
CRYSTAL STRUCTURES AND METHOD OF FABRICATING THEM

William H. Horton, Orlando, Fla., assignor to Piezo Technology Inc., Orlando, Fla., a corporation of Florida Filed Sept. 29, 1965, Ser. No. 491,456
4 Claims. (Cl. 310—9.1)

ABSTRACT OF THE DISCLOSURE

A crystal structure wherein the blank of piezoelectric material is lapped to provide a predetermined fundamental frequency and has electrodes plated on opposite sides thereof. A blank of substrate material having an aperture in it which is larger than the electrodes is affixed directly to one or both sides of the blank of piezoelectric material, with the apertures therein axially aligned with the electrodes. Lead attachments are provided, for connections to the electrodes, and cover plates can be fixedly secured atop each of the blanks of substrate material, for sealing the electrodes within the cavities formed by the apertures.

This invention relates to piezoelectric crystals and to improved methods for fabricating and packaging them.

The fundamental resonant frequency, $f_s$, for the thickness shear mode of vibration in a piezoelectric resonator (quartz AT cut, for example) is inversely proportional to the resonator thickness $t_b$. That is, $$f_s \doteq \frac{N}{t_b}$$

where N is an appropriate constant ($N \doteq 1660$ kc./s.-mm. for AT cut quartz). As a consequence, as frequency is increased such resonators become increasingly thin and fragile, requiring extreme care in lapping and subsequent handling operations. For most purposes, reduced yield due to breakage makes it economically unfeasible to fabricate fundamental mode thickness shear quartz resonators much above 30 mc./s. and costs increase rapidly above 20 mc./s. To reduce this problem, a harmonic overtone mode of vibration is used at higher frequencies, thereby allowing the blank to be approximately $n$ times the thickness that would be required for fundamental mode operation. That is, $$(f_s)_n \doteq \frac{N}{t_b}$$

where $n$ is the harmonic overtone number, an odd positive integer.

For fundamental modes, the static capacitance $C_e$ for the above type of resonator is related to the motional capacitance $C_1$ by the capacitance ratio $r$. That is, $$r = C_e/C_1$$

In overtone operation, the capacitance ratio $r_n$ is increased by approximately $n^2$. That is, $$r_n \doteq n^2 r$$

The static capacitance is related to electrode diameter $d_e$ and blank thickness in the following approximate manner:

$$C_e \doteq \frac{K_1 d_e^2}{t_b}$$
$$\doteq K_2 d_e^2 f/n$$

where $K_1$ and $K_2$ are appropriate constants depending on the angle of cut.

From this it can be seen that the motional capacitance varies approximately inversely with the cube of overtone number for a fixed frequency, electrode diameter squared product ($fd_e^2$), since $$C_1 \doteq \frac{1}{r_n} C_e$$
$$\doteq \frac{K_2 d_e^2 f}{r\ n^3}$$

Thus motional capacitance is reduced drastically with overtone operation unless the electrode diameter can be increased correspondingly. However, it can be shown that the vibrator unwanted mode performance is dependent upon the product $$\frac{1}{d_e^2 f}$$

since mode spacing is proportional to this factor.

In summary, it is found that overtone operation has the following disadvantages as compared with fundamental mode operation:

(1) Capacitance ratio is increased by $n^2$ (2) Motional capacitance is reduced by $1/n^3$ unless electrode diameter is increased, in which case (3) Unwanted mode problems are accentuated.

All of the above effects are undesirable for filter and some oscillator applications. Therefore, except for economic considerations, fundamental rather than overtone mode crystals would be used for many VHF applications.

In the November 1963 issue of the Journal of Acoustical Society of America, volume 35, No. 11, on pp. 1832 tical Society of America, vol. 35, No. 11, on pp. 1832 and 1833, there is an article entitled "Fundamental Operation of Quartz Transducers in the VHF Range, Using Silicate Bonds" by F. G. Eggers in which there is disclosed a method for fabricating an ultrasonic delay line to achieve fundamental operation up to 300M c.p.s. According to the disclosed method, a quartz transducer is bonded to an aluminum-plated fused-quartz rod (20 mm. long, 8 mm. diameter) and then ground down for fundamental operation. Many other methods have also been devised.

In addition to the problem of fabricating extremely thin crystals for fundamental or low-overtone operation at high frequencies, difficulties are encountered in handling them and, more particularly, in packaging and/or mounting them.

Reference may be had to U.S. Patent 3,073,975, 2,488,-781, 2,510,811, 2,326,923, and 2,771,561 to see but a few of the various techniques which have been used or proposed for mounting crystals. The military has also issued detailed specifications and requirements for mounting crystal units so as to assure proper operation and long life, as evidenced by Military Specification, Mil–C–3098/6. It is therefore apparent that mounting is an acute problem and not so easily solved, as evidenced by the numerous techniques which have been proposed.

It is an object of the present invention to provide improved methods for fabricating piezoelectric crystals.

It is further object of the present invention to provide improved methods for fabricating fundamental mode piezoelectric crystals, particularly for VHF applications. In this respect, it is contemplated that the method will be economical, hence making it feasible to use fundamental rather than overtone mode crystals for such applications.

It is a further object of the present invention to provide an improved method for fabricating piezoelectric resonator which will allow a critical resonator dimension (thickness) to be reduced below that feasible with present fabrication techniques. This will thereby allow fabrication of resonators for operation at higher frequencies for a given overtone mode of vibration than heretofore possible. In particular, fundamental mode operation at higher frequencies is made possible.

It is a still further object of the present invention to provide an improved method for fabricating piezoelectric resonators which will reduce the problem of handling and eliminate critical steps now followed in the fabrication of resonators, thereby lending itself more readily to more automated methods of production.

It is a still further object of the present invention to provide improved methods for fabricating fundamental mode crystals for VHF applications to eliminate breakage during fabrication.

It is a still further object of the present invention to provide improved methods for mounting piezoelectric crystals, particularly those used for VHF applications.

It is a still further object of the present invention to provide an improved method of fabricating piezoelectric resonators which results in a more compact, rugged, hermetically sealed housing package which lends itself to use in microcircuitry.

It is a still further object of the present invention to provide a new and improved piezoelectric crystal which is particularly applicable for fundamental mode operation in VHF applications.

Other objects of the invention will in part be obvious and will in part appear hereinafter.

The invention accordingly comprises the several steps and the relation of one or more of such steps with respect to each of the others and the apparatus embodying features of construction, combination of elements and arrangement of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawing, in which:

FIG. 1 is a bottom plan view of a piezoelectric crystal, fabricated in accordance with the invention;

FIG. 2 is a sectional view of the piezoelectric crystal of FIG. 1, taken along lines 2—2;

FIG. 3 is an exploded perspective view of the piezoelectric crystal, of FIG. 1, prior to plating the electrodes and connection tabs on it;

FIG. 4 is a sectional view illustrating a piezoelectric crystal structure, according to the present invention;

FIG. 5 is a bottom plan view of multiple resonators affixed to a single piece of substrate material;

FIG. 6 is a piezoelectric crystal fabricated in accordance with a second embodiment of the invention; and FIG. 7 is a sectional view taken along line 7—7 of FIG. 6.

Similar reference characters refer to similar parts throughout the several views of the drawing.

Referring now to the drawing, in FIGS. 1–3 there is shown a piezoelectric crystal 10 of wafer form having a resonator blank 12 affixed, in any suitable fashion, to a substrate 14. An electrode 16 and a connection tab 18 are plated on the resonator blank 12, on each of its opposite sides. The resonator blank 12 has a thickness corresponding to the desired fundamental frequency and the substrate 14 to which the resonator blank is affixed may have any desired thickness so long as it provides a rigid, sturdy support for the resonator blank.

In accordance with a first embodiment of the invention, a cylindrical-shaped orifice 15 of diameter $d_s$ is formed in the substrate, in axial alignment with the electrodes 16. Since the acoustic energy of a resonator is confined essentially to its electrode region, the orifice diameter $d_s$ should be larger than the electrode diameter $d_e$ so that damping of the resonator blank 12 is avoided. The choice of $d_s$ with respect to $d_e$ will depend upon the electrode thickness but, in general, a radial difference of 10 or more blank thicknesses will assure that negligible main mode energy is lost to the substrate.

Tab connections 18 can be made by plating them on the resonator blank 12 and on the substrate 14, with conductive paint 19 being used along the wall surface of the orifice 15. Mode suppression can be provided by using the tab plateback method, if desired. With this construction, the basic problem of resonator thinness can be circumvented without altering the resonator properties.

The method of fabricating piezoelectric crystal 10 is as follows: A resonator blank 12 and a substrate 14 of suitable thickness (depending on material used) having a cylindrical shaped orifice 15 formed therein are cemented together using an appropriate adhesive material. Each is preferably lapped to provide flat parallel surfaces prior to cementing them together. After cementing, the composite wafer is lapped in conventional manner until the thickness of the resonator blank 12 is as desired. The wafer structure is then plated to provide electrodes 16 on opposite sides thereof in conventional manner. Tab connections 18 are provided, by plating or any other suitable manner, and lead attachment along the wall surface of the orifice 15 can be accomplished using conductive paint or other suitable manner. Mode suppression can be provided, using the tab plateback method, if desired.

The crystal 10 may be mounted in a conventional crystal holder, however, a refined structure of more compact and rugged shape can be provided by fabricating the crystal as illustrated in FIG. 4. A second orificed substrate 22 is attached to the other surface of the resonator 12. The substrate 22 is provided with an appropriate finish and cover plates 23 and 24 are attached in any appropriate manner, as by use of an adhesive, to the exposed surfaces of the substrates 14 and 22. The seal joint may be either on the mating surface of the cover, or by addition of a ring covering the joint on the plate circumference. By using covers of the type shown, both surfaces of the resonator 12 are exposed prior to sealing, thereby allowing the critical surfaces to be thoroughly cleaned prior to sealing. This feature is particularly desirable should, for example, the cementing operation cause contamination.

In FIG. 5, the above described method is expanded to provide a number of resonators 30–33, each of which may have the same or a different frequency, affixed to a substrate 35 having a corresponding number of cylindrical-shaped orifices 36–39 formed therein. Each of the orifices 36–39 is positioned over its respective resonator 30–33, and is axially aligned with the resonator's electrodes, in the manner described above.

Each of the individual resonators 30–33 can be affixed to the substrate 35 and lapped until it has the desired thickness, in the manner desired. This may be accomplished by jigging the composite wafer and indexing it, to position each of the individual resonators for lapping. The resonator's electrodes and tab connections are then plated on them. With this construction, multiple resonators can be easily fabricated. Also, the entire assembly can be mounted, as illustrated in FIG. 4, by affixing another orificed substrate and cover plates to the wafer.

In FIGS. 6 and 7 there is illustrated a piezoelectric crystal 40 fabricated in accordance with still another embodiment of the invention. In this case, a resonator blank 42 has a substrate 44 and 45 affixed to its opposite sides, as in FIG. 4, but the substrates each have a tapered orifice 46 and 47 formed therein, respectively. The inner diameters of the orifices 46 and 47, which are the smaller diameters, are axially aligned with the electrodes 49 and 50 plated on the resonator blank 42 and are formed in the same fashion as the diameter $d_s$ of the orifice 15 formed in the substrate 14 of the FIGS. 1–3.

The side walls 51 and 52 of the respective orifices 46 and 47 are coated with a conductive material 53, preferably prior to affixing the substrates 44 and 45 to the resonator blank 42. The electrodes 49 and 50 are plated on the resonator blank 42 with tab connections 55 and 56 extending onto conductive material 53. The exposed orifices are then capped with tapered metal plates 58 and 59, respectively, and electrical connections can be made with them. It may be noted that the conductive material 53 provides electrode connections of short length and low inductance which are compatible with coaxial type external connections. Each of these features is particularly desirable when the crystal is used for VHF applications.

In each of the above described embodiments of the invention, it can be seen that a method of fabrication which allows the thickness of a resonator blank to be lapped to a much smaller dimension than presently feasible is provided. Also, the method provides a structure which is less critical to handle since it is rigidly supported, so that breakage is reduced during handling, as well as fabrication. In addition, the structure can be easily mounted and/or packaged to provide a package which is superior to those presently available. Furthermore, it is evident from the description that although the invention provides a method of fabrication which is particularly applicable in forming crystal structures for fundamental mode operation, it is not intended to preclude application to overtone mode of operation or to limit the similar advantages obtained when using overtone operation.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described, what is claimed as new and desired to be secured by Letters Patent is:

1. A crystal structure comprising: a blank of crystal material which has been lapped to provide a predetermined fundamental frequency and which has electrodes plated on opposite sides thereof and in axial alignment; a pair of blanks of substrate material fixedly secured to opposite sides of said blank of crystal material, each of said blanks of substrate material having an aperture formed therein which is larger than and in axial alignment with said electrodes; lead attachments for connecting to said electrodes; and a cover plate fixedly secured atop each of said blanks of substrate material sealing the electrodes on said blank of crystal material within the cavities formed by said apertures.

2. A crystal structure comprising: a blank of crystal material which has been lapped to provide a predetermined fundamental frequency and which has electrodes plated on opposite sides thereof and in axial alignment; a pair of blanks of substrate material fixedly secured to opposite sides of said blank of crystal material, each of said blanks of substrate material having a tapered aperture formed therein in axial alignment with said electrodes; a coating of conductive material on the side walls of said apertures; lead attachments for connecting said electrodes to the conductive material on the side walls of respective ones of said apertures; and a cover plate sealing said apertures in said blanks of substrate material.

3. The crystal structure of claim 2, wherein said cover plates sealing said apertures in said blanks of substrate material are of a conductive material and in contact with the conductive material of the side walls of respective ones of said apertures, whereby electrical connections to said electrodes can be made by electrical connections to said cover plates, respectively.

4. A piezoelectric crystal comprising: a blank of piezoelectric crystal material and a blank of substrate material, one surface of each of said blanks being lapped and said lapped surfaces being fixedly secured together in face-to-face relationship, the opposite surface of said blank of piezoelectric crystal material being thereafter lapped to a predetermined thickness, whereby a blank having a thickness far less than heretofore generally possible can be provided, electrodes plated on opposite sides of said blank of piezoelectric crystal material, an aperture in said blank of substrate material larger than said electrodes and in axial alignment therewith, and lead attachments formed along the wall surface of said aperture and to said electrode therein and on the surface of said piezoelectric crystal material to the other one of said electrodes, respectively.

References Cited

UNITED STATES PATENTS

| | | | |
|---|---|---|---|
| 2,481,806 | 9/1949 | Wolfskill | 310—9 |
| 2,824,219 | 2/1958 | Fisher | 310—9 |
| 2,891,177 | 6/1959 | Hafner | 310—9 |
| 2,912,605 | 11/1959 | Tibbetts | 310—9 |
| 3,073,975 | 1/1963 | Bigler | 310—9 |
| 3,173,035 | 3/1965 | Fisher | 310—9 |

J. D. MILLER, *Primary Examiner.*